(12) United States Patent
Zhou (10) Patent No.: US 11,199,398 B2
(45) Date of Patent: Dec. 14, 2021

(54) LASER PROJECTION MODULE, DEPTH CAMERA AND ELECTRONIC DEVICE

(71) Applicant: GUANGDONG OPPO MOBILE TELECOMMUNICATIONS CORP., LTD., Guangdong (CN)

(72) Inventor: Qiqun Zhou, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 467 days.

(21) Appl. No.: 16/296,425

(22) Filed: Mar. 8, 2019

(65) Prior Publication Data
US 2019/0278099 A1  Sep. 12, 2019

(30) Foreign Application Priority Data

Mar. 12, 2018 (CN) .......................... 201810202118.0

(51) Int. Cl.
*G02B 27/42* (2006.01)
*G02B 27/30* (2006.01)
(Continued)

(52) U.S. Cl.
CPC ............ *G01B 11/25* (2013.01); *G01S 7/4814* (2013.01); *G01S 7/497* (2013.01); *G01S 17/89* (2013.01);
(Continued)

(58) Field of Classification Search
CPC ....... G01B 11/25; G01S 7/4814; G01S 7/481; G01S 7/4817; G01S 7/497; G01S 17/89;
(Continued)

(56) References Cited

U.S. PATENT DOCUMENTS

| | | | |
|---|---|---|---|
| 5,406,543 A | 4/1995 | Kobayashi et al. | |
| 6,438,075 B1 * | 8/2002 | Takeda .................. | G11B 7/131 369/112.04 |

(Continued)

FOREIGN PATENT DOCUMENTS

| | | |
|---|---|---|
| CN | 102062952 | 5/2011 |
| CN | 102739936 | 3/2017 |

(Continued)

OTHER PUBLICATIONS

TIPO, Office Action for TW Application No. 108108332, dated Aug. 26, 2019.

(Continued)

*Primary Examiner* — John R Lee
(74) *Attorney, Agent, or Firm* — Hodgson Russ LLP (57) ABSTRACT

A laser projection module, a depth camera and an electronic device are provided. The laser projection module includes a laser emitter configured to emit laser; a reflection element arranged in a laser emission direction of the laser emitter and configured to reflect the laser emitted from the laser emitter; a diffractive optical element arranged in a light exiting direction of the reflection element and configured to diffract the laser reflected by the reflection element; and an optical detector arranged between the laser emitter and the reflection element, and configured to receive the laser and detect an intensity of a non-zero order beam of the laser.

20 Claims, 5 Drawing Sheets

(51) Int. Cl.

| | |
|---|---|
| *H04N 13/254* | (2018.01) |
| *H04N 13/296* | (2018.01) |
| *H04N 5/225* | (2006.01) |
| *G01B 11/25* | (2006.01) |
| *G01S 7/497* | (2006.01) |
| *G01S 7/481* | (2006.01) |
| *G01S 17/89* | (2020.01) |
| *H04M 1/02* | (2006.01) |
| *H01S 5/0683* | (2006.01) |
| *H01S 5/02253* | (2021.01) |
| *H04N 5/222* | (2006.01) |
| *H01S 5/024* | (2006.01) |
| *H01S 5/0236* | (2021.01) |
| *H01S 5/02255* | (2021.01) |

(52) U.S. Cl.
CPC .......... *G02B 27/30* (2013.01); *G02B 27/425* (2013.01); *H01S 5/02253* (2021.01); *H01S 5/0683* (2013.01); *H04M 1/0272* (2013.01); *H04N 5/2252* (2013.01); *H04N 5/2256* (2013.01); *H04N 13/254* (2018.05); *H04N 13/296* (2018.05); *H01S 5/0236* (2021.01); *H01S 5/02255* (2021.01); *H01S 5/02469* (2013.01); *H04M 1/0264* (2013.01); *H04N 5/2226* (2013.01)

(58) Field of Classification Search
CPC ..... G01S 17/88; G02B 27/30; G02B 27/4233; H04N 13/254; H04N 13/296; H04N 5/2252; H04N 5/2256; H01S 5/02253; H01S 5/02255; H01S 5/0225; H01S 5/0683; H01S 5/06825; H01S 5/0236; H01S 5/02469; H04M 1/0272
See application file for complete search history.

(56) References Cited

U.S. PATENT DOCUMENTS

| | | | | |
|---|---|---|---|---|
| 6,445,671 | B1 * | 9/2002 | Takeda | G11B 7/123 369/120 |
| 6,587,481 | B1 * | 7/2003 | Seong | G11B 7/127 372/101 |
| 7,099,085 | B2 * | 8/2006 | Yamada | G11B 7/123 359/15 |
| 7,569,801 | B2 * | 8/2009 | Oka | G11B 7/1263 250/201.5 |
| 7,963,447 | B2 * | 6/2011 | Yu | G06K 7/10584 235/462.43 |
| 8,829,406 | B2 * | 9/2014 | Akerman | H01L 31/14 250/205 |
| 9,959,465 | B2 * | 5/2018 | Georgiou | H04N 13/271 |
| 10,310,281 | B1 * | 6/2019 | Lee | G02B 27/42 |
| 10,418,780 | B1 * | 9/2019 | Hwang | H01S 5/0683 |
| 10,545,457 | B2 * | 1/2020 | Lee | G02B 27/0944 |
| 10,890,779 | B2 * | 1/2021 | Bai | H04N 5/2254 |
| 10,944,237 | B2 * | 3/2021 | Victoria | H01S 5/0235 |
| 2002/0089764 | A1 * | 7/2002 | Ikenaka | G11B 7/1374 359/719 |
| 2008/0093569 | A1 | 4/2008 | Kamisada et al. | |
| 2010/0294928 | A1 | 11/2010 | Bunton et al. | |
| 2011/0114857 | A1 | 5/2011 | Akerman et al. | |
| 2011/0128506 | A1 * | 6/2011 | Takagi | H01S 5/4006 353/31 |
| 2013/0201289 | A1 | 8/2013 | Billerbeck et al. | |
| 2014/0071428 | A1 * | 3/2014 | Suzuki | G01S 7/484 356/4.01 |
| 2014/0160493 | A1 * | 6/2014 | McEldowney | G01J 1/32 356/614 |
| 2016/0127714 | A1 | 5/2016 | Hazeghi et al. | |
| 2016/0254638 | A1 * | 9/2016 | Chen | H04N 13/254 362/11 |
| 2017/0288366 | A1 | 10/2017 | Hazeghi | |
| 2018/0048880 | A1 * | 2/2018 | Trail | H04N 5/2354 |
| 2018/0059430 | A1 * | 3/2018 | Mor | G01B 11/2513 |
| 2019/0181618 | A1 * | 6/2019 | Ge | H01S 5/423 |
| 2019/0278099 | A1 * | 9/2019 | Zhou | G01S 7/497 |
| 2020/0003870 | A1 * | 1/2020 | Chen | G01S 17/10 |
| 2020/0099919 | A1 * | 3/2020 | Wu | G06T 7/521 |
| 2020/0201064 | A1 * | 6/2020 | Ge | G02B 27/425 |
| 2020/0228764 | A1 * | 7/2020 | Chen | G03B 21/006 |
| 2021/0191143 | A1 * | 6/2021 | Chern | G02B 5/1814 |

FOREIGN PATENT DOCUMENTS

| | | |
|---|---|---|
| CN | 106918303 | 7/2017 |
| CN | 107167996 | 9/2017 |
| CN | 107167997 | 9/2017 |
| CN | 206833136 | 1/2018 |
| CN | 206877030 | 1/2018 |
| CN | 206908092 | 1/2018 |
| CN | 104583804 | 3/2018 |
| CN | 107783361 | 3/2018 |
| CN | 108490632 | 9/2018 |
| TW | 201514544 | 4/2015 |
| WO | 2017112073 | 6/2017 |

OTHER PUBLICATIONS

EPO, Office Action for EP Application No. 19162085.5, dated Jun. 28, 2019.
SIPO, First Office Action for CN Application No. 201810202118, dated Apr. 24, 2019.
WIPO, English translation of the ISR and WO for PCT/CN2019/070854, Mar. 27, 2019.
SIPO, Notice of Registration for CN Application No. 201810202118.0, dated Oct. 10, 2019.
IP India, First Examination Report for IN 201914009421, dated Dec. 7, 2020.

* cited by examiner

LASER PROJECTION MODULE, DEPTH CAMERA AND ELECTRONIC DEVICE

CROSS REFERENCE TO RELATED APPLICATION

This application claims priority to Chinese Application No. 201810202118.0, filed on Mar. 12, 2018, the entire disclosure of which is incorporated herein by reference.

FIELD

The present disclosure relates to a field of imaging technology, and particularly to a laser projection module, a depth camera and an electronic device.

BACKGROUND

When the laser emitter emits laser, the laser will scatter. After the scattering, beams superimposed and concentrated at a center of the light-emitting surface of the laser emitter become into a zero order beam, and beams transmitted towards the surrounding of the light-emitting surface of the laser emitter are non-zero order beams. When the intensity of the zero order beam is too large, the zero order beam cannot be completely diffracted when transmitted to the diffractive optical element, thus resulting in that the zero order beam emitted by the diffractive optical element has a large intensity, which may harm the user's eyes.

SUMMARY

Embodiments of the present disclosure provide a laser projection module, a depth camera and an electronic device.

The laser projection module according to embodiments of the present disclosure includes a laser emitter, a reflection element, a diffractive optical element and an optical detector. The laser emitter is configured to emit laser. The reflection element is arranged in a laser emission direction of the laser emitter and configured to reflect the laser emitted from the laser emitter. The diffractive optical element is arranged in a light exiting direction of the reflection element and configured to diffract the laser reflected by the reflection element. The optical detector is arranged between the laser emitter and the reflection element, and configured to detect an intensity of a non-zero beam of the laser.

The depth camera according to embodiments of the present disclosure includes a laser projection module, an image collector and a processor. The laser projection module includes a laser emitter, a reflection element, a diffractive optical element and an optical detector. The laser emitter is configured to emit laser. The reflection element is configured to reflect the laser emitted from the laser emitter. The diffractive optical element is configured to diffract the laser reflected by the reflection element. The optical detector is arranged between the laser emitter and the reflection element, and configured to receive the laser so as to output an electrical signal. The image collector is configured to acquire a laser pattern projected by the laser projection module into a target space. The processor is configured to determine the intensity of the non-zero beam of the laser according to the electrical signal, to decrease the emission power of the laser emitter when the intensity of the non-zero beam is less than a predetermined intensity and to process the laser pattern to obtain a depth image.

The electronic device according to embodiments of the present disclosure includes a housing and a depth camera. The depth camera is arranged in the housing and configured to be exposed out of the housing to acquire a depth image. The depth camera includes a laser projection module, an image collector and a processor. The laser projection module includes a laser emitter, a reflection element, a diffractive optical element and an optical detector. The laser emitter is configured to emit laser. The reflection element is configured to reflect the laser emitted from the laser emitter. The diffractive optical element is configured to diffract the laser reflected by the reflection element. The optical detector is arranged between the laser emitter and the reflection element, and configured to receive the laser so as to output an electrical signal. The image collector is configured to acquire a laser pattern projected by the laser projection module into a target space. The processor is configured to determine the intensity of the non-zero beam of the laser according to the electrical signal, to decrease the emission power of the laser emitter when the intensity of the non-zero beam is less than a predetermined intensity and to process the laser pattern to obtain a depth image.

Additional aspects and advantages of the present disclosure will be given in the following description, some of which will become apparent from the following description or be learned from practices of the present disclosure.

BRIEF DESCRIPTION OF THE DRAWINGS

The above and/or additional aspects and advantages of the present disclosure will become apparent and easy to understand from descriptions of the embodiments with reference to the drawings.

DETAILED DESCRIPTION

Embodiments of the present disclosure will be described in detail and examples of the embodiments will be illustrated in the accompanying drawings. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

In the present disclosure, it should be noted that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals and/or letters may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Figure 1:
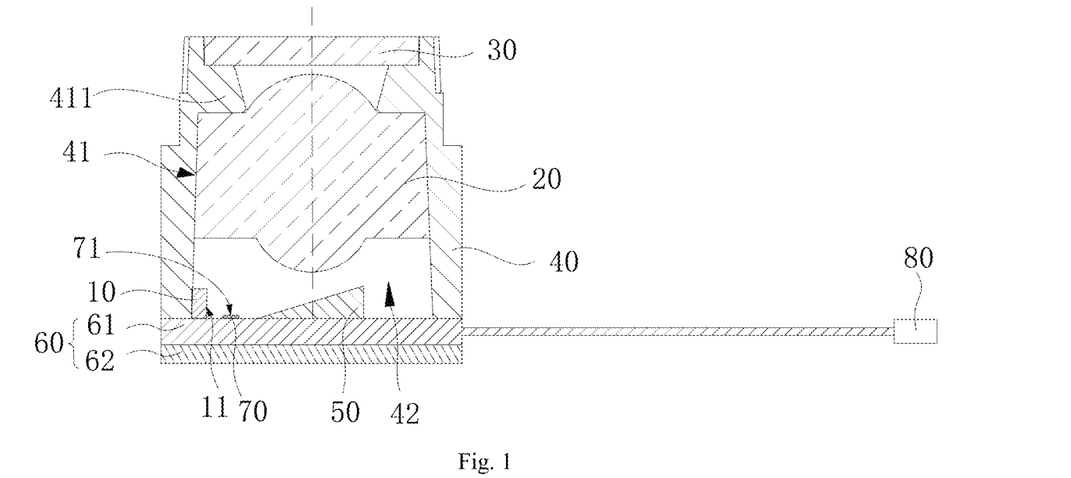
FIG. 1 is a schematic view illustrating a laser projection module according to some embodiments of the present disclosure.

As illustrated in FIG. 1, the present disclosure provides a laser projection module 100. The laser projection module 100 comprises a laser emitter 10, a reflection element 50, a diffractive optical element 30 and an optical detector 70. The laser emitter 10 is used to emit laser. The reflection element 50 is used to reflect the laser emitted from the laser emitter 10. The diffractive optical element 30 is used to diffract the laser reflected by the reflection element 50. The optical detector 70 is arranged between the laser emitter 10 and the reflection element 50 for receiving the laser so as to output an electrical signal, and the electrical signal is used to determine an intensity of a non-zero order beam of the laser. An emission power of the laser emitter 10 is reduced, when the intensity of the non-zero beam is less than a predetermined intensity.

As illustrated in FIGS. 1-5, in some embodiments, the laser projection module 100 further includes a collimation element 20. The collimation element 20 is arranged between the laser emitter 10 and the reflection element 50; or/and the collimation element 20 is arranged between the reflection element 50 and the diffractive optical element 30.

As illustrated in FIG. 1, in some embodiments, the laser projection module 100 further includes a substrate assembly 60 and a lens barrel 40. The substrate assembly 60 includes a substrate 62 and a circuit board 61 carried on the substrate 62. The laser emitter 10 is carried on the circuit board 61. The lens barrel 40 includes a side wall 41 and a bearing stage 411 extending from the side wall 41.

The side wall 41 is disposed on the circuit board 61 and defines an accommodating chamber 42 together with the circuit board 61. The accommodating chamber 42 accommodates the laser emitter 10, the reflection element 50, the collimation element 20, the diffractive optical element 30 and the optical detector 70 therein.

As illustrated in FIG. 1, in some embodiments, the reflection element 50 is disposed on the circuit board 61 and at a side of the laser emitter 10. A laser emission direction of the laser emitter 10 is perpendicular to an optical axis of the laser reflected by the reflection element 50.

As illustrated in FIGS. 2 to 5, in some embodiments, the optical detector 70 includes a light-receiving surface 71, and the light-receiving surface 71 is parallel to the circuit board 61, or perpendicular to the circuit board 61, or inclined at an angle with respect to the circuit board 61.

Figure 6:
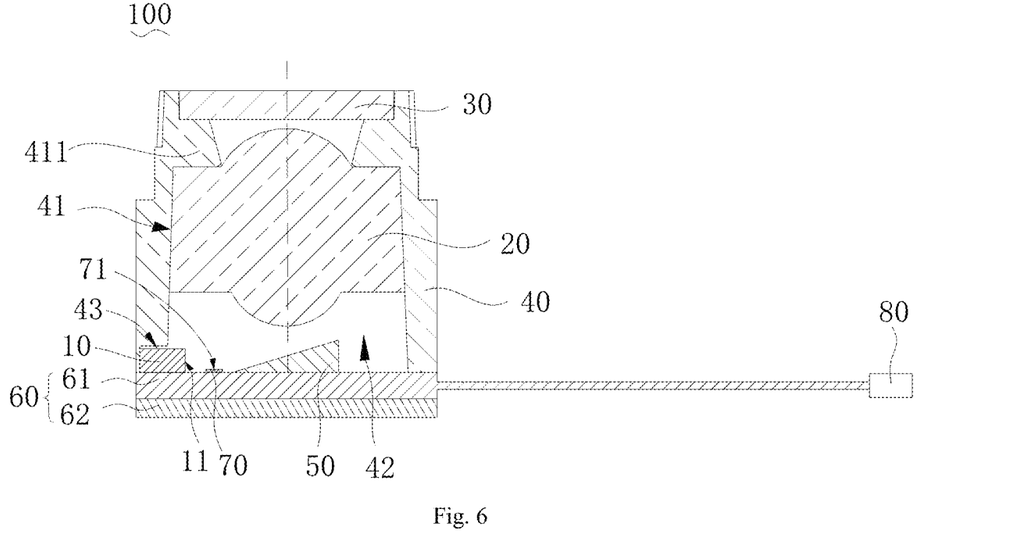
FIG. 6 and FIG. 7 are schematic views illustrating a laser projection module according to some embodiments of the present disclosure.

As illustrated in FIG. 6, in some embodiments, the side wall 41 defines a groove 43. The laser emitter 10 is an edge-emitting laser and the edge-emitting laser is partially accommodated in the groove 43.

Figure 7:
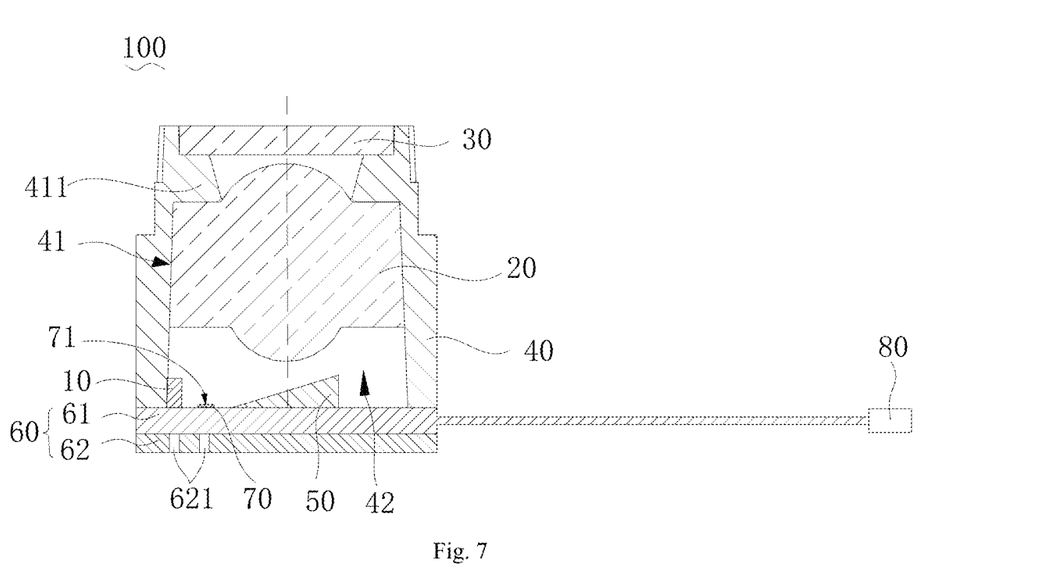

As illustrated in FIG. 7, in some embodiments, the substrate 62 has a heat-dissipation hole 621. The heat-dissipation hole 621 is filled with thermal conductive materials.

As illustrated in FIGS. 1 and 6, in some embodiments, the laser emitter 10 includes a vertical-cavity surface-emitting laser and/or an edge-emitting laser.

Figure 8:
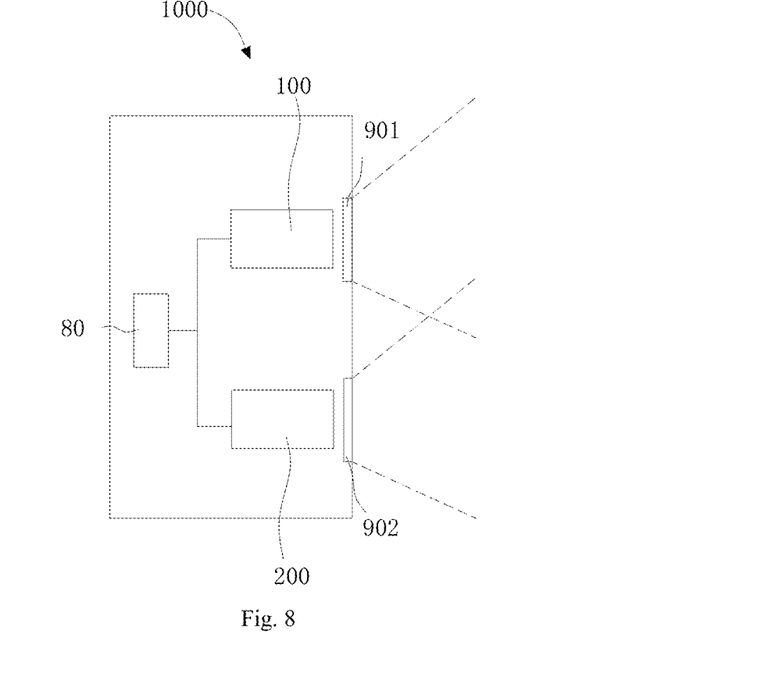
FIG. 8 is a schematic view illustrating a depth camera according to some embodiments of the present disclosure.

As illustrated in FIG. 8, the present disclosure further provides a depth camera 1000. The depth camera 1000 includes a laser projection module 100 according to any one of the above embodiments, an image collector 200 and a processor 80. The image collector 200 is used to acquire a laser pattern projected into a target space after being diffracted by the diffractive optical element 30. The processor 80 is coupled to the laser projection module 100 and the image collector 200, respectively. The processor 80 is configured to process the laser pattern to obtain a depth image.

Figure 9:
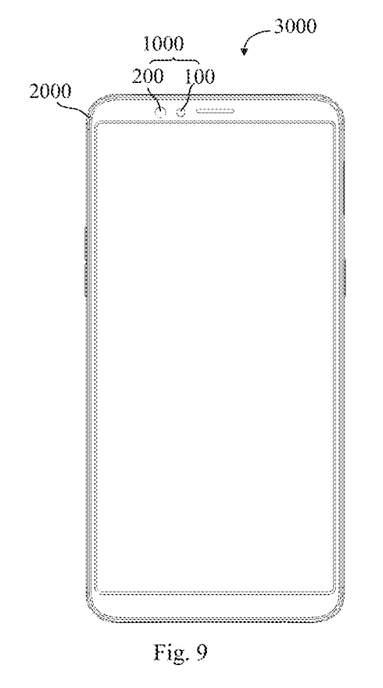
FIG. 9 is a schematic view illustrating an electronic device according to some embodiments of the present disclosure.

As illustrated in FIG. 9, the present disclosure further provides an electronic device 3000. The electronic device 3000 includes a housing 2000 and a depth camera 1000 according to the above embodiments. The depth camera 1000 is arranged in the housing 2000 and configured to be exposed out of the housing 2000 to acquire the depth image.

As illustrated in FIG. 1, the laser projection module 100 according to embodiments of the present disclosure includes a lens barrel 40 and a substrate assembly 60. The substrate assembly 60 includes a substrate 62 and a circuit board 61. The circuit board 61 is carried on the substrate 62. The lens barrel 40 includes a side wall 41 and a bearing stage 411 extending from the side wall 41. The side wall 41 is disposed on the circuit board 61 and defines an accommodating chamber 42 together with the circuit board 61. The laser projection module 100 further includes a laser emitter 10, a reflection element 50, a collimation element 20, a diffractive optical element 30 and an optical detector 70. The laser emitter 10, the reflection element 50, the collimation element 20, the diffractive optical element 30 and the optical detector 70 are accommodated in the accommodating chamber 42. In some embodiments, the laser emitter 10 is carried on the circuit board 61 for emitting laser. The reflection element 50 is also carried on the circuit board 61 for reflecting the laser emitted from the laser emitter 10. The collimation element 20 and the diffractive optical element 30 are arranged in sequence along a light exiting direction of the reflection element 50, and the diffractive optical element 30 is disposed on the bearing stage 411. The collimation element 20 is configured to collimate the laser reflected by the reflection element 50. The diffractive optical element 30 is configured to diffract the laser collimated by the collimation element 20, so as to form a laser pattern. The optical detector 70 is arranged between the laser emitter 10 and the reflection element 50. The optical detector 70 is configured to receive the laser emitted by the laser emitter 10 so as to output an electrical signal. The electrical signal may be used to determine an intensity of a non-zero order beam of the laser. An emission power of the laser emitter 10 is reduced, when the intensity of the non-zero order beam is less than a predetermined intensity.

The reflection element 50 is disposed at a side of the laser emitter 10. A laser emission direction of the laser emitter 10 is perpendicular to an optical axis of the laser reflected by the reflection element 50. The optical detector 70 includes a light-receiving surface 71 parallel to the circuit board 61.

The optical detector 70 may be an element that can convert a light intensity signal into an electrical signal, such as a photoresistor, a photodiode or a phototriode.

It may be understood that, if the optical detector 70 is arranged between the laser emitter 10 and the collimation element 20, when the laser emitter 10 emits the laser, the laser emitted by the laser emitter 10 includes a zero order beam and a non-zero order beam since the laser scatters when emitted, such that a small portion of light in the non-zero order beam irradiates the light-receiving surface 71 of the optical detector 70, and the optical detector 70 generates and outputs an electric signal after receiving this portion of light, in which the electric signal represents the intensity of the non-zero order beam. The zero order beam is a beam gathered and superimposed at a center of the light-emitting surface after the laser scatters, and the non-zero order beam is a beam transmitted towards the surrounding of the light-emitting surface after the laser scatters. When a voltage having a same magnitude is applied to the laser emitter 10 each time the laser emitter 10 is used, the electrical signal output by the optical detector 70 is substantially identical each time. When a certain voltage is applied to the laser emitter 10 and the electrical signal output by the optical detector 70 is low, it indicates that the zero order beam in the laser emitted by the laser emitter 10 has a high intensity, thus resulting in a low intensity of the non-zero order beam. Generally, the zero order beam will not be diffracted when passing through the diffractive optical element 30, and thus it will directly exits, which may cause damage to the user's eyes since the energy of the directly-exiting zero order beam is too high.

In the laser projection module 100 according to embodiments of the present disclosure, the optical detector 70 is arranged between the laser emitter 10 and the reflection element 50, and is used to detect the intensity of the non-zero order beam. When the non-zero order beam has a low intensity, it can be determined that the energy of the zero order beam may be too high, and thus actions for reducing the emission power of the laser emitter 10 are executed immediately, so as to avoid the problem that the user's eyes may be injured when the zero order beam has excess energy, and hence to improve the safety of using the laser projection module 100.

Figure 2:
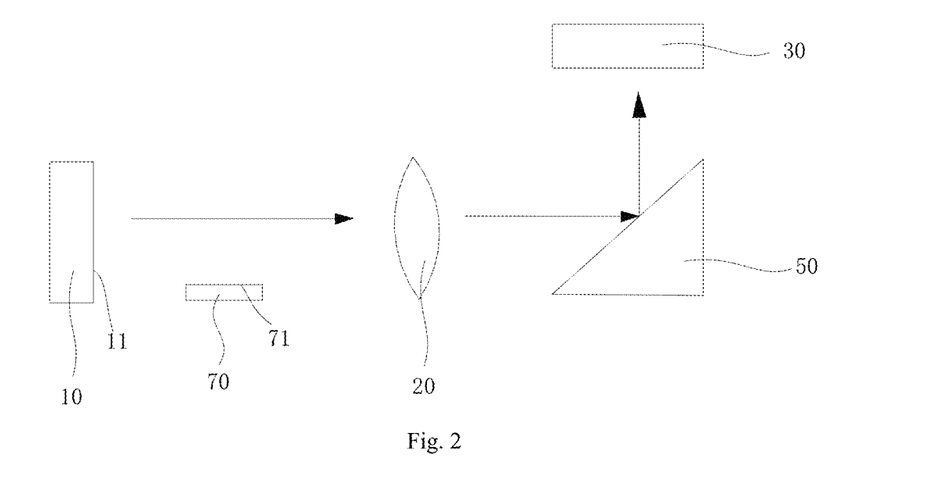
FIGS. 2 to 5 are schematic views illustrating a light path of a laser projection module according to some embodiments of the present disclosure.

As illustrated in FIG. 2, in some embodiments, when only one collimation element 20 is provided, the collimation element 20 may also be disposed between the laser emitter 10 and the reflection element 50. In this case, the collimation element 20 collimates the laser emitted by the laser emitter 10, the reflection element 50 reflects the laser collimated by the collimation element 20 and the diffractive optical element 30 diffracts the laser reflected by the reflection element 50. Arranging the collimation element 20 between the reflection element 50 and the diffractive optical element 30 may reduce a thickness of the laser projection module 100.

Figure 3:
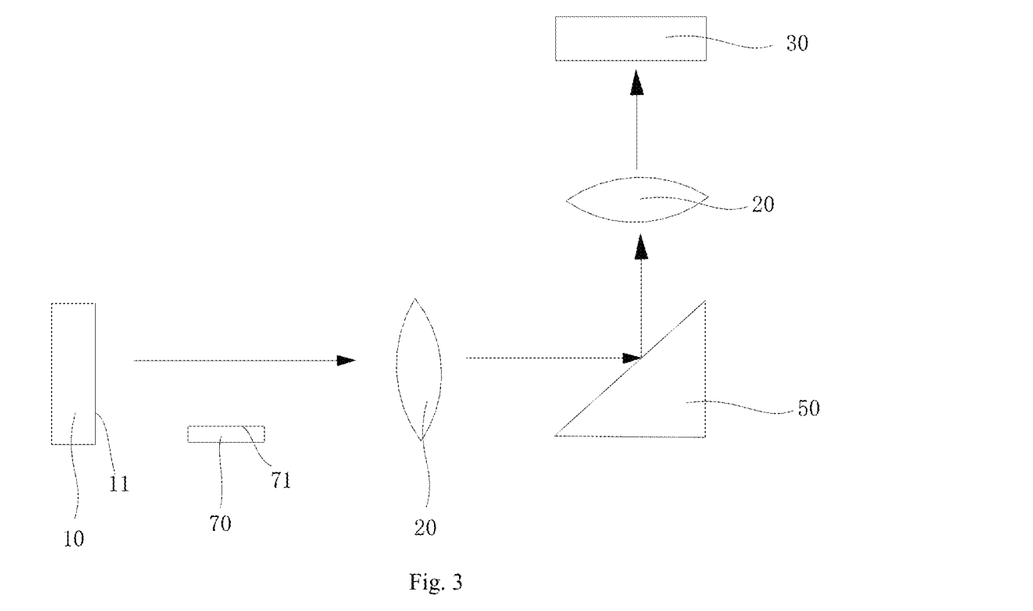

As illustrated in FIG. 3, in some embodiments, two collimation elements 20 may be provided. One of the two collimation elements 20 is disposed between the laser emitter 10 and the reflection element 50, this collimation element 20 is used for collimating the laser emitted by the laser emitter 10 and the reflection element 50 is used for reflecting the laser collimated by the collimation element 20. The other collimation element 20 is arranged between the reflection element 50 and the diffractive optical element 30, this collimation element 20 is used for collimating the laser reflected by the reflection element 50 and the diffractive optical element 30 diffracts the laser collimated by the collimation element 20. Arranging two collimation elements 20 in the laser projection module 100 may enhance the collimation effect of the laser and improve the performance of the laser projection module 100.

Figure 4:
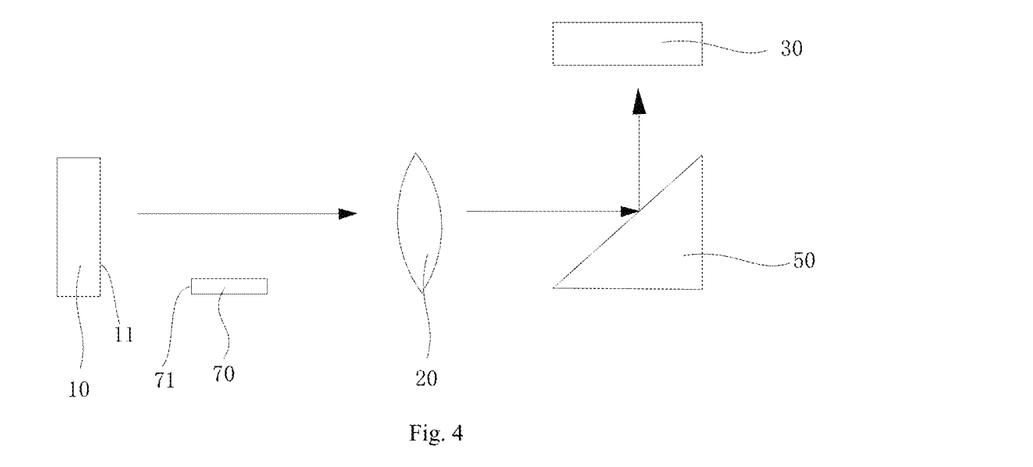

As illustrated in FIG. 4, in some embodiments, the light-receiving surface 71 of the optical detector 70 is perpendicular to the circuit board 61. In this case, the collimation element(s) 20 may be disposed as follows: one collimation element 20 is provided and disposed between the laser emitter 10 and the reflection element 50 (as illustrated in FIG. 4); or, one collimation elements 20 is provided and disposed between the reflection element 50 and the diffractive optical element 30 (not illustrated); or, two collimation elements 20 are provided, one is disposed between the laser emitter 10 and the reflection element 50, and the other is disposed between the reflection element 50 and the diffractive optical element 30 (not illustrated). In this way, the light-receiving surface 71 is perpendicular to the laser emission direction of the laser emitter 10, such that the laser emitted by the laser emitter 10 is vertically incident on the light-receiving surface 71, and thus the optical detector 70 can detect the intensity of the non-zero order beam more accurately.

Figure 5:
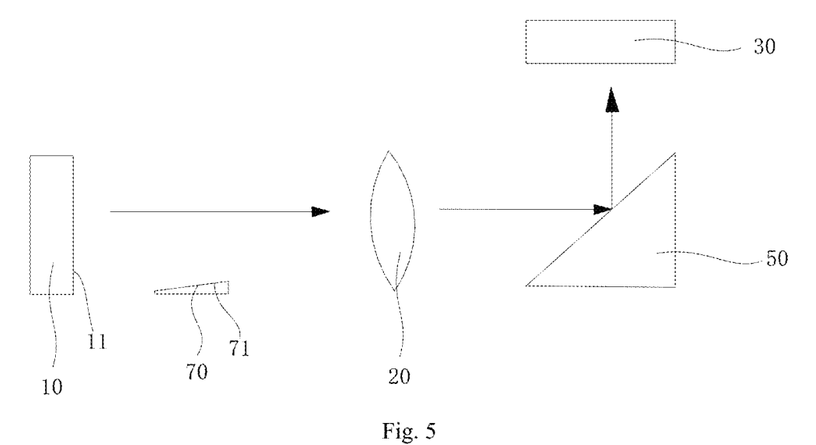

As illustrated in FIG. 5, in some embodiments, the light-receiving surface 71 of the optical detector 70 is inclined at an angle with respect to the circuit board 61. In this case, the collimation element(s) 20 may be disposed as follows: one collimation element 20 is provided and disposed between the laser emitter 10 and the reflection element 50 (as illustrated in FIG. 5); or, one collimation element 20 is provided and disposed between the reflection element 50 and the diffractive optical element 30 (not illustrated); or, two collimation elements 20 are provided, one is disposed between the laser emitter 10 and the reflection element 50, and the other is disposed between the reflection element 50 and the diffractive optical element 30 (not illustrated). In this case, supposing that the optical detector 70 is a phototriode, the light-receiving surface 71 can accommodate more phototriodes and the optical detector 70 can receive more lights, such that the intensity of the non-zero order beam can be detected more accurately.

In some embodiments, the laser emitter 10 may be a vertical-cavity surface-emitting laser (VCSEL), the laser emission direction of the vertical-cavity surface-emitting laser is perpendicular to the optical axis of the laser reflected by the reflection element 50. Since the vertical-cavity surface-emitting laser has a multipoint light source distributed in an irregular array, the laser patterns projected by the laser projection module 100 have relatively high irrelevance, which benefits improvement of the acquisition accuracy of the depth image.

In some embodiments, the laser emitter 10 may be an edge-emitting laser (EEL). In some embodiments, the laser emitter 10 may be a distributed feedback laser (DFB). In this case, the light-emitting surface 11 of the laser emitter 10 faces the reflection element 50, that is, the laser emission direction of the laser emitter 10 is perpendicular to the optical axis of the laser reflected by the reflection element 50. Characterized by a low temperature drift and a single-point light-emitting structure, the distributed feedback laser needs no array structure and can be easily produced, and thus the cost of the laser projection module 100 is low.

Furthermore, when the laser emitter 10 is the distributed feedback laser, since the laser of the distributed feedback laser obtains a power gain through feedback of a grating structure, a power enhancement of the distributed feedback laser is realized by increasing the length of the distributed feedback laser and/or increasing the injection current. However, increasing the injection current will raise the power consumption of the distributed feedback laser and cause a severe heat emission problem. Consequently, it is preferred to achieve the power enhancement of the distributed feedback laser by increasing the length of the distributed feedback laser. In order to decrease a width of the laser projection module 100, as illustrated in FIG. 6, a groove 43 is defined in the side wall 41 of the lens barrel 40 of the laser projection module 100, and the distributed feedback laser is partially accommodated in the groove 43. In this way, the groove 43 can provide more space to dispose the distributed feedback laser without increasing the width of the laser projection module 100. Besides, preferably, the length, width and height of the groove 43 should correspond to the length, width and height of the distributed feedback laser, respectively. In some embodiments, the length of the groove 43 is slightly larger than the length of the distributed feedback laser, the width of the groove 43 is slightly larger than the width of the distributed feedback laser, and the height of the groove 43 is slightly larger than the height of the distributed feedback laser, such that the groove 43 can fix the distributed feedback laser to some extent, so as to prevent the distributed feedback laser from shifting or falling off. Or, further, the distributed feedback laser and the groove 43 adhered together by a sealant after the distributed feedback laser is partially accommodated in the groove 43, and the sealant may be a thermal conductive glue. In this way, on one hand, the distributed feedback laser can be fixed, and on the other hand, heat generated by the distributed feedback laser can be dissipated.

As illustrated in FIG. 7, in some embodiments, the substrate 62 has heat-dissipation holes 621. Positions of the heat-dissipation holes 621 are opposite to the position of the laser emitter 10 on the circuit board 61 and the location of the optical detector 70 on the circuit board 61, respectively. In this way, heat generated by the laser emitter 10 and the optical detector 70 can be dissipated. The heat-dissipation holes 621 may also be filled with the thermal conductive glue, thus further facilitating dissipation of the heat generated by the laser emitter 10 and the optical detector 70.

As illustrated in FIG. 8, the present disclosure also provides a depth camera 1000. The depth camera 1000 according to the embodiments of the present disclosure includes a laser projection module 100 according to any one of the above embodiments, an image collector 200 and a processor 80. The image collector 200 is used for acquiring the laser pattern projected into a target space after being diffracted by the diffractive optical element 30. The processor 80 is coupled to the laser projection module 100 and the image collector 200 respectively, and is used for processing the laser pattern to acquire the depth image.

In some embodiments, the laser projection module 100 projects the laser pattern into the target space through a projection window 901. The image collector 200 acquires the laser pattern modulated by a target object through an acquisition window 902. The image collector 200 may be an infrared camera. The processor 80 calculates a deviation value between each pixel point in the laser pattern and a corresponding pixel point in a reference pattern with an image matching algorithm, and then obtains the depth image of the laser pattern based on the deviation value. The image matching algorithm may be a digital image correlation (DIC) algorithm. Certainly, other image matching algorithms may be adopted to replace the DIC algorithm.

In the laser projection module 100 of the depth camera 1000 according to embodiments of the present disclosure, the optical detector 70 is arranged between the laser emitter 10 and the reflection element 50, and is used to detect the intensity of the non-zero order beam. When the non-zero order beam has a low intensity, it can be determined that the energy of the zero order beam may be too high, and thus actions for reducing the emission power of the laser emitter 10 are executed immediately, so as to avoid the problem that the user's eyes may be injured when the zero order beam has excess energy, and hence to improve the safety of using the laser projection module 100.

As illustrated in FIG. 9, an electronic device 3000 according to embodiments of the present disclosure includes a housing 2000 and a depth camera 1000 according to the above embodiments. The depth camera 1000 is arranged in the housing 2000 and configured to be exposed out of the housing 2000 to acquire the depth image.

In the laser projection module 100 of the electronic device 3000 according to embodiments of the present disclosure, the optical detector 70 is arranged between the laser emitter 10 and the reflection element 50, and is used to detect the intensity of the non-zero order beam. When the non-zero order beam has a low intensity, it can be determined that the energy of the zero order beam may be too high, and thus actions for reducing the emission power of the laser emitter 10 are executed immediately, so as to avoid the problem that the user's eyes may be injured when the zero order beam has excess energy, and hence to improve the safety of using the laser projection module 100.

Reference throughout this specification to "an embodiment", "some embodiments", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. In addition, without conflicting, various embodiments or examples or features of various embodiments or examples described in the present specification may be combined by those skilled in the art.

Although embodiments of present disclosure have been illustrated and described above, it should be understood that above embodiments are just explanatory, and cannot be construed to limit the present disclosure, for those skilled in the art, changes, alternatives, and modifications can be made to the embodiments without departing from the scope of the present disclosure.

What is claimed is:
1. A laser projection module, comprising:
a laser emitter configured to emit laser light;
a reflection element arranged in a laser emission direction of the laser emitter and configured to reflect the laser light emitted from the laser emitter;
a diffractive optical element arranged in a light exiting direction of the reflection element and configured to diffract the laser light reflected by the reflection element; and
an optical detector arranged between the laser emitter and the reflection element, and configured to receive a non-zero order beam of the laser light emitted from the laser emitter and detect an intensity of the non-zero order beam of the laser light emitted from the laser emitter.

2. The laser projection module according to claim 1, wherein the laser projection module further comprises a collimation element,
the collimation element is arranged in at least one manner selected from a group of being between the laser emitter and the reflection element, and being between the reflection element and the diffractive optical element.

3. The laser projection module according to claim 2, wherein the laser projection module further comprises:
a substrate assembly comprising a substrate and a circuit board carried on the substrate, the laser emitter being carried on the circuit board; and
a lens barrel comprising a side wall, the side wall being disposed on the circuit board and defining an accommodating chamber together with the circuit board, and the accommodating chamber accommodating the laser emitter, the reflection element, the collimation element, the diffractive optical element and the optical detector therein.

4. The laser projection module according to claim 3, wherein the reflection element is disposed on the circuit board, and the laser emission direction of the laser emitter is perpendicular to an optical axis of the laser light reflected by the reflection element.

5. The laser projection module according to claim 3, wherein the optical detector comprises a light-receiving surface, and the light-receiving surface is parallel to the circuit board.

6. The laser projection module according to claim 3, wherein the optical detector comprises a light-receiving surface, and the light-receiving surface is perpendicular to the circuit board.

7. The laser projection module according to claim 3, wherein the optical detector comprises a light-receiving surface, and the light-receiving surface is inclined at an angle with respect to the circuit board.

8. The laser projection module according to claim 3, wherein the side wall defines a groove therein, the laser emitter is an edge-emitting laser and the edge-emitting laser is partially accommodated in the groove.

9. The laser projection module according to claim 8, wherein the edge-emitting laser is adhered in the groove by a sealant, and the sealant is a thermal conductive glue.

10. The laser projection module according to claim 8, wherein the edge-emitting laser has a light-emitting surface facing the reflection element.

11. The laser projection module according to claim 3, wherein the substrate has a heat-dissipation hole, and the heat-dissipation hole is filled with thermal conductive materials.

12. The laser projection module according to claim 11, wherein a position of the heat-dissipation hole is opposite to a position of at least one of the laser emitter and the optical detector on the circuit board.

13. The laser projection module according to claim 3, wherein the lens barrel comprises a bearing stage extending from the side wall, and the diffractive optical element is arranged on the bearing stage.

14. The laser projection module according to claim 1, wherein the laser emitter comprises at least one of a vertical-cavity surface-emitting laser and an edge-emitting laser.

15. A depth camera, comprising:
a laser projection module, comprising:
a laser emitter configured to emit laser light;
a reflection element configured to reflect the laser light emitted from the laser emitter;
a diffractive optical element configured to diffract the laser light reflected by the reflection element; and
an optical detector arranged between the laser emitter and the reflection element, and configured to receive a non-zero order beam of the laser light emitted from the laser emitter so as to output an electrical signal;
an image collector configured to acquire a laser pattern projected by the laser projection module into a target space; and
a processor configured to determine an intensity of the non-zero beam of the laser light emitted from the laser emitter according to the electrical signal, to decrease an emission power of the laser emitter when the intensity of the non-zero beam is less than a predetermined intensity, and to process the laser pattern to obtain a depth image.

16. The depth camera according to claim 15, wherein the laser projection module further comprises one collimation element, and the one collimation element is arranged between the laser emitter and the reflection element.

17. The depth camera according to claim 15, wherein the laser projection module further comprises one collimation element, and the one collimation element is arranged between the reflection element and the diffractive optical element.

18. The depth camera according to claim 15, wherein the laser projection module further comprises two collimation elements, one of the two collimation elements is arranged between the laser emitter and the reflection element, and the other one of the two collimation elements is between the reflection element and the diffractive optical element.

19. An electronic device, comprising a housing and a depth camera, the depth camera being arranged in the housing and configured to be exposed out of the housing to acquire an depth image, the depth camera comprising:
a laser projection module, comprising:
a laser configured to emit laser light;
a reflection element configured to reflect the laser light emitted from the laser emitter;
a diffractive optical element configured to diffract the laser light reflected by the reflection element; and
an optical detector arranged between the laser emitter and the reflection element, and configured to receive a non-zero order beam of the laser light emitted from the laser emitter so as to output an electrical signal;
an image collector configured to acquire a laser pattern projected by the laser projection module into a target space; and
a processor configured to determine an intensity of the non-zero beam of the laser light emitted from the laser emitter according to the electrical signal, to decrease an emission power of the laser emitter when the intensity of the non-zero beam is less than a predetermined intensity, and to process the laser pattern to obtain a depth image.

20. The electronic device according to claim 19, wherein the laser projection module further comprises a collimation element,
the collimation element is arranged in at least one manner selected from a group of being between the laser emitter and the reflection element, and being between the reflection element and the diffractive optical element.

* * * * *